(12) United States Patent
Verspecht

(10) Patent No.: US 10,387,592 B1
(45) Date of Patent: Aug. 20, 2019

(54) METHOD AND SYSTEM FOR CHARACTERIZING, MODELING AND SIMULATING NON-LINEAR COMPONENTS HAVING LONG TERM MEMORY EFFECTS

(75) Inventor: Jan Verspecht, Opwijk (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 1621 days.

(21) Appl. No.: 12/787,736

(22) Filed: May 26, 2010

(51) Int. Cl.
*G06F 17/50* (2006.01)
*G06G 7/62* (2006.01)

(52) U.S. Cl.
CPC .......... *G06F 17/5022* (2013.01); *G06G 7/62* (2013.01)

(58) Field of Classification Search
None
See application file for complete search history.

(56) References Cited

U.S. PATENT DOCUMENTS

| | | | |
|---|---|---|---|
| 7,295,961 B2 * | 11/2007 | Root et al. | 703/14 |
| 7,924,956 B2 | 4/2011 | Maltsev et al. | |
| 8,005,162 B2 | 8/2011 | Cai et al. | |
| 8,914,271 B2 | 12/2014 | Verspecht | |
| 2005/0026145 A1 * | 2/2005 | Pang | G06F 19/22 435/6.12 |
| 2005/0116775 A1 | 6/2005 | McBeath et al. | |
| 2005/0157814 A1 | 7/2005 | Cova et al. | |
| 2007/0194776 A1 | 8/2007 | Bossche | |
| 2008/0130789 A1 | 6/2008 | Copeland et al. | |
| 2008/0133204 A1 * | 6/2008 | Liu | H03F 1/3258 703/14 |
| 2009/0121788 A1 | 5/2009 | Deisch | |
| 2010/0225389 A1 | 9/2010 | Teetzel | |
| 2011/0068868 A1 | 3/2011 | Shi et al. | |
| 2011/0163806 A1 | 7/2011 | Hongo | |
| 2011/0242933 A1 | 10/2011 | Maissant et al. | |
| 2012/0086507 A1 | 4/2012 | Kim et al. | |
| 2012/0108189 A1 | 5/2012 | McCallister et al. | |
| 2012/0119832 A1 | 5/2012 | Bai et al. | |

OTHER PUBLICATIONS

Wood et al., A Behavioral Modeling Approach to Nonlinear Model-Order Reduction for RF/Microwave ICs and Systems, Sep. 2004, IEEE, vol. 52 No. 9, pp. 2274-2284.*
Walker, Behavioral Modeling and Characterization of Nonlinear Operation in RF and Microwave Systems, 2005, North Carolina State University, pp. 1-342.*
Verspecht et al., Extension of X-parameters to Include Long-Term Dynamic Memory Effects, 2009, IEEE, pp. 741-744.*

(Continued)

*Primary Examiner* — Aniss Chad
*Assistant Examiner* — Bernard E Cothran

(57) ABSTRACT

An envelope behavioral model is developed and used in a system and method that simulates and predicts outputs of a non-linear component. An analyzer generates a test signal which is provided as input to the non-linear component. Model kernels representative of static and dynamic parts of the model are extracted from an output of the non-linear component responsive to the test signal. The dynamic part represents memory effects of the non-linear component. The model kernels are then used by a simulator to predict the output of the non-linear component responsive to signals of a modulation type.

20 Claims, 5 Drawing Sheets

(56) References Cited

OTHER PUBLICATIONS

Gallou et al., An Improved Behavioral Modeling Technique for High Power Amplifiers with Memory, 2001, IEEE, pp. 983-986.*

Verspecht et al., Polyharmonic Distortion Modeling, Jun. 2006, IEEE, pp. 44-57.*

Radio-Electronics.com, Vector Network Analyzer VNA Tutorial, 2017, Radio-Electronics.com, pp. 1-4.*

Wood et al., Nonlinear Microwave/RF System Design and Simulating using Agilent ADS 'System—Data Models', Dec. 2003, Agilent Technologies, Inc., pp. 1-5 (Year: 2003).*

Clausen, Small and large modeling of MM-Wave MHEMT devices, 2003, University of South Florida Scholar Commons, pp. 1-156 (Year: 2003).*

Hazouard et al., New Solid Power Amplifiers Design Using Large Signal S Parameters, 2001, IEEE, pp. 1-4 (Year: 2001).*

H. Ku et al., "Quantifying memory effects in RF power amplifiers", IEEE Transactions on Microwave Theory and Techniques, vol. 50, No. 12, Dec. 2002, pp. 2843-2849.

J. Verspecht et al., "Polyharmonic distortion modeling", IEEE Microwave Magazine, vol. 7, No. 3, Jun. 2006, pp. 44-57.

J. Verspecht et al., "Multi-tone, Multi-port, and Dynamic Memory Enhancements to PHD Nonlinear Behavioral Models from Large-signal Measurements and Simulations Measurements", 2007 IEEE/MTT-S International Microwave Symposium, 2007, pp. 969-972.

J. C. Pedro et al., "A comparative overview of microwave and wireless power-amplifier behavioral modeling approaches", IEEE Transactions on Microwave Theory and Techniques, vol. 53, No. 4, Apr. 2005, pp. 1150-1163.

F. Filicori et al., "A nonlinear integral model of electron devices for HB circuit analysis", IEEE Transactions on Microwave Theory and Techniques, vol. 40, No. 7, Jul. 1992, pp. 1456-1465.

M. Isaksson et al., "A comparative analysis of behavioral models for RF power amplifiers", IEEE Transactions on Microwave Theory and Techniques, vol. 54, No. 1, Jan. 2006, pp. 348-359.

A. Soury et al., "A new behavioral model taking into account nonlinear memory effects and transient behaviors in wideband SSPAs", 2002 IEEE MTT-S International Microwave Symposium Digest, vol. 2, 2002, pp. 853-856.

E. Ngoya et al., "Chapter 3: Envelope Domain Methods for Behavioral Modeling", Fundamentals of Nonlinear Behavioral Modeling for RF and Microwave Design, J. Wood et al., Artech House, 2005, pp. 37-86.

Moon, et al.,"Enhanced Hammerstein Behavioral Model for Broadband Wireless Transmitters," IEEE Transactions on Microwave Theory and Techniques, vol. 59, No. 4, pp. 924-933, Apr. 2011.

Younes, et al.,"An Accurate Complexity-Reduced 'PLUME' Model for Behavioral Modeling and Digital Predistortion of RF Power Amplifiers," IEEE Transactions on Industrial Electronics, vol. 58, No. 4, pp. 1397-1405, Apr. 2011.

Mkadem, et al.,"Physically Inspired Neural Network Model for RF Power Amplifier Behavioral Modeling and Digital Predistortion," IEEE Transactions on Microwave Theory and Techniques, vol. 59, No. 4, pp. 913-923, Apr. 2011.

Verspecht, et al. "Extension of Xparameters to Include Long-Term Dynamic Memory Effects," Conference Record of the 2009 IEEE MTT-S International Microwave Symposium, Jun. 2009.

Verspecht, et al. "A Simplified Extension of X-parameters to Describe Memory Effects for Wideband Modulated Signals," Conference Record of the Spring 2010 ARFTG Conference, Anaheim, USA, Jun. 2010.

Edouard Ngoya et al.,"Chapter 3: Envelop Domain Methods for Behavioral Modeling," Fundamentals of Nonlinear Behavioral Modeling for RF and Microwave Design, 2005 Artech House, pp. 1-53.

* cited by examiner

METHOD AND SYSTEM FOR CHARACTERIZING, MODELING AND SIMULATING NON-LINEAR COMPONENTS HAVING LONG TERM MEMORY EFFECTS

BACKGROUND

Behavioral modeling of microwave components is of great interest to system designers of amplifiers. There are, however, difficulties in characterizing, describing and simulating the nonlinear behavior of amplifiers and other microwave components that are stimulated by signals that have a high peak-to-average ratio and that are within a power range covering the full operating range.

For example, amplifier behavior may be driven into full saturation, which may be characterized as hard nonlinear. Most of the existing approaches are based on Volterra theory and as such rely on polynomial approximations. Polynomial approximations can not easily handle hard nonlinear behavior like full saturation. Also, amplifier behavior shows memory effects. Such memory effects are caused by dynamically varying operating conditions, such as temperature and bias, for example, among other causes. These changes are induced by the input signal itself and vary at relatively slow rates compared to the frequency of the RF carrier. As a consequence, the instantaneous behavior of the amplifier becomes a function not only of the instantaneous value of the input signal, but also of the past values of the input signal, referred to as "long term memory effect". Conventional approaches, such as simple compression and AM-to-PM (amplitude modulation-to-phase modulation) characteristic or a more advanced Poly-Harmonic Distortion (PHD) model, that can handle hard nonlinear behavior, have no straightforward technique for dealing with memory effects.

What is needed, therefore, is a method of effecting behavior modeling of nonlinear components that overcomes at least the shortcomings of known methods described above.

SUMMARY

In a representative embodiment, a method of modeling a non-linear component includes applying a predetermined test signal to the non-linear component to produce an output envelope signal; extracting model functions from the output envelope signal, the model functions corresponding to a dynamic part and a static part of the output envelope signal, the dynamic part representing memory effects of the non-linear component; and using the extracted model functions to simulate predicted outputs of the non-linear component responsive to input signals of a modulation type.

In another representative embodiment, a system for modeling a non-linear component includes an analyzer configured to generate a set of large signal steps, apply the set of large signal steps to the non-linear component which provides an output envelope signal responsive to the set of large signal steps, and to extract model functions from the output envelope signal provided by the non-linear component, the model functions corresponding to a static part and a dynamic part of the output envelope signal, and the dynamic part representing memory effects of the non-linear component; and a simulator configured to simulate predicted outputs of the non-linear component responsive to input signals of a modulation type using the extracted model functions from the analyzer.

In a further representative embodiment, a computer readable medium stores a program executable by a computer for modeling a non-linear component, the computer readable medium including an applying code segment for applying a predetermined test signal to the non-linear component to produce an output envelope signal; an extracting code segment for extracting model functions from the output envelope signal, the model functions corresponding to a dynamic part and a static part of the output envelope signal, the dynamic part representing memory effects of the non-linear component; and a simulating code segment for simulating predicted outputs of the non-linear component responsive to input signals of a modulation type, using the extracted model functions.

BRIEF DESCRIPTION OF THE DRAWINGS

The example embodiments are best understood from the following detailed description when read with the accompanying drawing figures. Wherever applicable and practical, like reference numerals refer to like elements.

DETAILED DESCRIPTION

Figure 1:
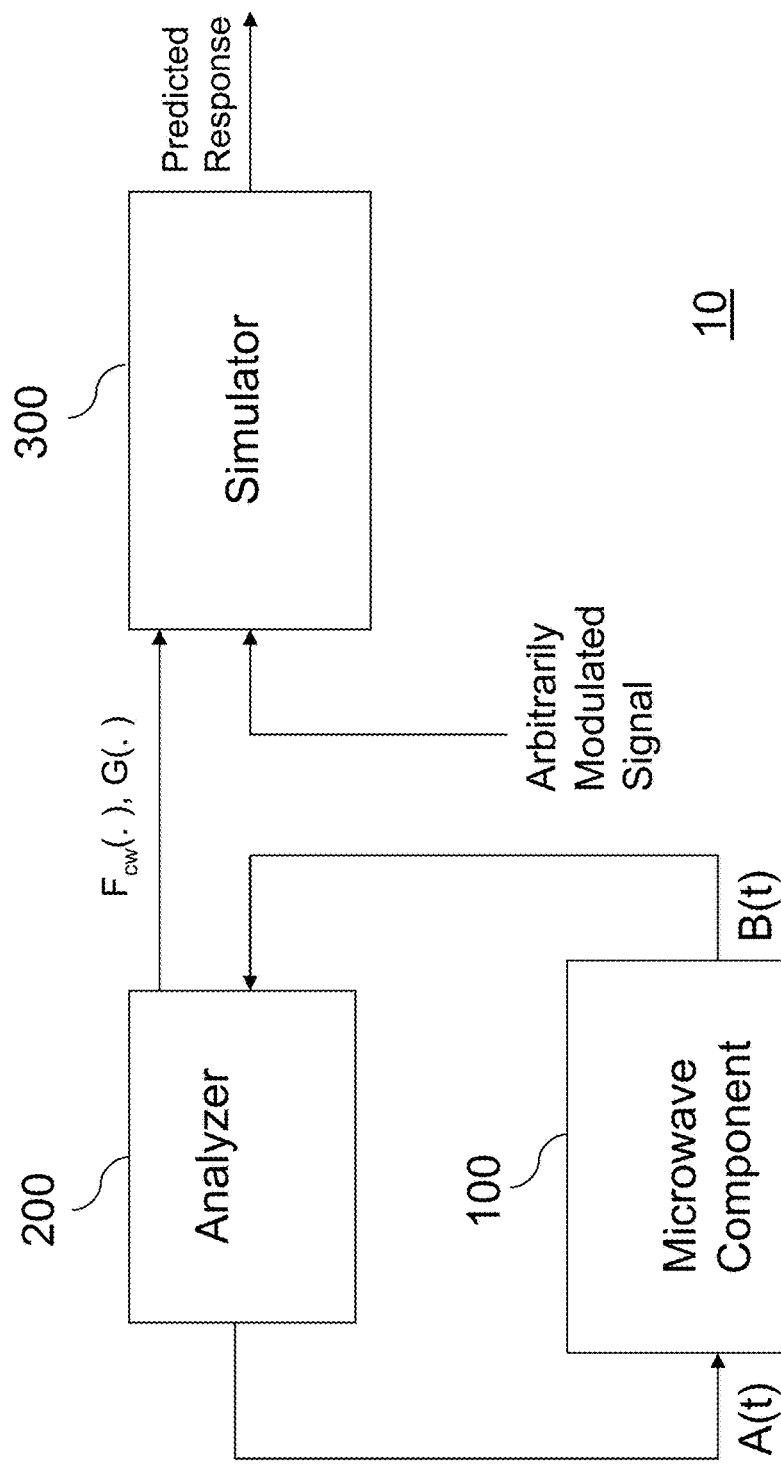
FIG. 1 is a simplified block diagram illustrating a modeling system for a microwave component, using a behavioral model, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

Generally, various representative embodiments provide a black-box complex behavioral model and corresponding identification methodology, which describes hard nonlinear behavior, as well as memory effects of a device under test (DUT). In representative embodiments, the DUT comprises a microwave component. However, this is merely illustrative and the use of other DUTs is contemplated. The microwave component may comprise an amplifier, for instance, but may comprise other components such as transistors, diodes, monolithic microwave integrated circuits (MMICS), multichip modules (MCMs), non-linear electronic analog components or circuits, and non-linear RF systems, without departing from the scope of the present teachings. Likewise, in various embodiments, the microwave component may be represented, in whole or in part, by a software program, as discussed below. The behavioral model can be completely and relatively easily identified from measuring a simple set of RF large signal step responses provided as output from the microwave component. The set of RF large signal step responses may be provided in response to a set of RF large signal steps applied to the microwave component by an independent external microwave source, an internal source in a non-linear vector network analyzer (NVNA) or any suitable source capable of providing the stimulus. The input set of RF large signal steps may be such that the signal switches from one value to another value at time zero, so that the whole range of possible input RF signals to the microwave component are covered. The resultant behavioral model can be implemented in an envelope simulator or the like, to predict the response of the microwave component to arbitrarily modulated signals, such as simple two-tone excitations, pulsed excitations and more complex modulated RF excitations, or standard wideband digitally modulated formats for communication signals such as wideband code division multiple access (WCDMA), long term evolution (LTE) and worldwide interoperability for microwave access (WiMAX), for example. The behavioral model can predict nonlinear characteristics under large signal modulated operating conditions such as for example spectral regrowth, compression, intermodulation products, adjacent channel power ratio (ACPR), and error vector magnitude (EVM), among others.

The description as follows provides introduction and derivation of the behavioral model, and subsequently illustrative implementations thereof.

Figure 2:
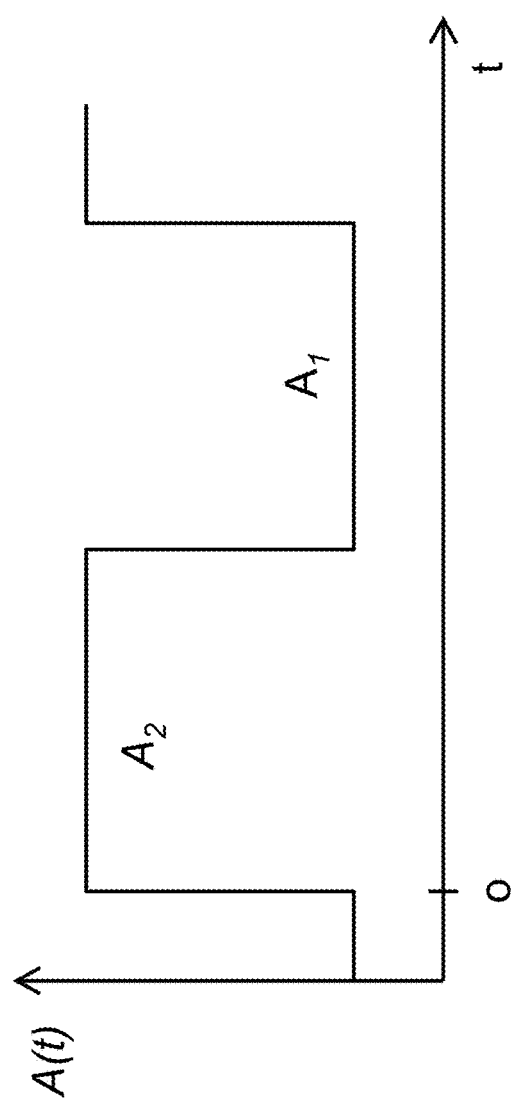
FIG. 2 is a graph illustrating a set of RF large signal steps applied to a microwave component, according to a representative embodiment.

FIG. 1 is a simplified block diagram illustrating a modeling system 10 that uses a behavioral model, according to a representative embodiment. In the depicted embodiment, the modeling system 10 includes microwave component 100, which may be characterized in the alternative as a device under test (DUT), connected to analyzer 200. In this example, the microwave component 100 is a power amplifier, although other types of DUTs may be used in the alternative, as discussed below. The analyzer 200 is configured to generate and output a test signal A(t), which may be a set of multiple RF large signal steps, such as shown in FIG. 2, discussed below. Microwave component 100 subsequently provides an output signal B(t) consisting of a signal set of RF large signal step responses responsive to the set of RF large signal steps A(t). Using the output signal B(t), the analyzer 200 determines model kernels $F_{CW}(\cdot)$ and $G(\cdot)$ based on a behavioral model described by equation (1), the derivation of which is discussed below.

With respect to the derivation of the behavioral model, a simple matched system will be considered, having only one input signal A(t), the incident fundamental, and one output signal B(t), the amplified signal. For purposes of explanation, the signals are considered to be complex envelope representations of a modulated carrier. However, it should be understood that all of the concepts described hereinafter can be extended to mismatched conditions by including the incident and scattered wave signals $A_2(t)$ and $B_1(t)$, respectively, at the input and output ports, and can also be extended to harmonic effects by including the harmonics of the carrier signal, without departing from the scope of the present teachings. It will be assumed that the input signal can be represented as a modulated carrier with a fixed frequency. The model may be characterized as a so-called low-pass equivalent model that only processes the envelope information signal. The new model equation is presented as equation (1) as follows:

$$B(t) = \left( F_{CW}(|A(t)|) + \int_0^\infty G(|A(t)|, |A(t-u)|, u) du \right) \exp(j\phi(A(t))). \quad (1)$$

A basic concept or characteristic of the behavioral model of a representative embodiment is that B(t) can be written as the superposition of a static part represented by the nonlinear function $F_{cw}(\cdot)$, and a dynamic part represented by a simple integral over time of a nonlinear function $G(\cdot)$. As should be apparent to one of ordinary skill in the art, symbol or terminology such as $F_{cw}(\cdot)$ or $G(\cdot)$ as variously used throughout, particularly the use of $(\cdot)$, signifies a generic representation of one or more arguments such as time, distance, temperature, etc. Each of the nonlinear function $F_{cw}(\cdot)$ and the integrated function $G(\cdot)$ is a function of the instantaneous amplitude of the input signal A(t). The dependency on the phase of the input signal is represented as a separate multiplicative vector $\exp(j\phi(A(t)))$. To simplify the mathematical notation that follows, the following should be understood:

$$\Phi(t) = \exp(j\phi(A(t))).$$

As would be apparent to one of ordinary skill in the art, this phase dependency can be explained by the principle of time delay invariance. The static part behaves like a classic PHD-model. The dynamic part is original as it represents the memory effects. These are described as the integral effect of a general nonlinear function of the instantaneous amplitude of the input signal A(t), the past values of the input signal A(t-u) and how long ago that past value occurred (variable u). As shown in the following, the model equation (1) can be derived using the notion of hidden variables.

A starting point for the derivation of model equation (1) is a simple static PHD-model equation, which is equivalent to a simple compression and AM-to-PM characteristic, as shown in equation (2):

$$B(t) = F(|A(t)|)\Phi(t) \quad (2).$$

In equation (2), the function $F(\cdot)$ represents mapping from the amplitude of the input signal to the corresponding output signal amplitude and phase, whereby the dependency on the phase of the input signal is represented as a separate multiplicative vector.

Memory effects may be introduced using one or more hidden variables. The idea is that, in a system with memory, the mapping from the input signal to the output signal is not a function of the input signal amplitude only, but is also a function of an arbitrary number N of a priori unknown hidden variables $h_1(t), h_2(t), \ldots, h_N(t)$. These variables represent time varying physical quantities inside the component, such as temperature, bias voltage or current, trapping states, or the like, that influence the mapping from the input signal to the output signal. With the introduction of the hidden variables, equation (2) becomes equation (3), as follows:

$$B(t) = F(|A(t)|, h_1(t), h_2(t), \ldots, h_N(t))\Phi(t) \quad (3).$$

To make equation (3) useful in the context of a black-box modeling approach, an assumption regarding the relationship between the hidden variables and the input signal is necessary. Although a priori information on the physics of the microwave component could be used to find this relationship, the black-box assumption on the relationship between the input signal and the hidden variables instead may be mathematically expressed as shown in equation (4):

$$\forall i: h_i(t) = \int_0^\infty P_i(|A(t-u)|)k_i(u)du. \quad (4)$$

As would be apparent to one of ordinary skill in the art, the symbol ∀ indicates the universal quantifier which may be informally read as "given any" or "for all".

Equation (4) expresses that the $i^{th}$ hidden variable is generated by a linear filter operation, characterized by its impulse response $k_i(\cdot)$, that operates on a nonlinear function $P_i(\cdot)$ of the input signal amplitude $|A(\cdot)|$. The nonlinear function $P_i(\cdot)$ may be interpreted as a source term that describes how the input signal is related to the excitation of a particular hidden variable, and in general this is a nonlinear relationship. For example, the nonlinear function $P_1(\cdot)$ may be considered to be power dissipation as a function of the input signal, whereby $h_1(\cdot)$ is temperature. The impulse response $k_i(\cdot)$ describes the actual dynamics of a hidden variable, whereby $k_1(\cdot)$ may describe thermal relaxation, for example. A special case of the above equations with only one hidden variable may be provided as follows $$h_1(t) = \int_0^\infty |A(t-u)|^2 e^{-\frac{u}{R}}\frac{du}{R}, \text{ or } P_1(x) = x^2 \text{ and } k_1(x) = \frac{1}{R}e^{-\frac{x}{R}},$$

wherein u is a dummy integration variable and R is a particular value that represents a time scale or parameter. In this above noted special case, equation (4) is physically related to the assumption that the amplitude squared relates to the bias current flowing through a first order linear bias circuit, which causes a variation of the bias voltage, which modulates the PHD-model. However, it should be understood that other physical effects may be described by equation (4), such as trapping effects and self-heating, whereby the dissipated power is a nonlinear function of A(t) and causes temperature changes, which are linearly related to the dissipated power, and which modulate the PHD-model. However, the nonlinear function $P_i(\cdot)$ and the impulse response $k_i(\cdot)$ that describe the actual dynamics of a hidden variable are not limited to the above examples, but should be understood to encompass a variety of other examples, as would be apparent to one of ordinary skill in the art.

The link with equation (1) is subsequently made based on the assumption that equation (3) can be linearized in the hidden variables $h_i(t)$. In order to linearize, an operating point must be chosen. In the following, linearization around the steady state solution for the hidden variables that corresponds to the instantaneous amplitude $|A(t)|$ is chosen. In other words, linearization is chosen around the steady state solution that the system would reach assuming that the input amplitude is kept constant for all future time instants, the amplitude being equal to the instantaneous input amplitude. This linearization implicitly assumes that deviations of the hidden variables from their steady state solution are always small enough not to violate the linearity principle. These steady state solutions are a function of the input signal amplitude and are denoted in the following by $h_i^{CW}(\cdot)$. For example, the value of $h_i^{CW}(X)$ is equal to the asymptotic value of the hidden variable $h_i(t)$ when a constant input signal amplitude equal to X is applied. Of note, the argument of $h_i^{CW}(\cdot)$ is a signal amplitude, whereas the argument of the hidden variable $h_i(t)$ is time. The functions $h_i^{CW}(\cdot)$ are easily calculated by simply substituting A(t-u) by a constant X in equation (3):

$$\forall i: h_i^{CW}(X) = \int_0^\infty P_i(X)k_i(u)du = W_i P_i(X), \text{ with} \quad (5)$$

$$W_i = \int_0^\infty k_i(u)du. \quad (6)$$

Equation (3) can then be rewritten as:

$$B(t)=F(|A(t)|,W_1P_1(|A(t)|)+\Delta_1(t),W_2P_2(|A(t)|)+\Delta_2(t),\ldots)\cdot\Phi(t) \quad (7),$$

$$\text{with } \forall i: \Delta_i(t)=h_i(t)-W_iP_i(|A(t)|) \quad (8).$$

In equation (8), the new variable $\Delta_i(t)$ represents the deviation of the hidden variable $h_i(t)$ from its steady state solution corresponding to the instantaneous input signal amplitude. It is now further assumed that equation (3) can be linearized in these deviations from steady state $\Delta_i(t)$. This results in the following equations (9)-(11):

$$B(t) = \left(F_{CW}(|A(t)|) + \sum_{i=1}^{N} D_i(|A(t)|)\Delta_i(t)\right)\Phi(t), \quad (9)$$

with $$F_{CW}(|A(t)|)=F(|A(t)|,W_1P_1(|A(t)|),W_2P_2(|A(t)|),\ldots) \quad (10)$$

and $$D_i(x) = \left.\frac{\partial F}{\partial h_i}\right|_{(x,W_1P_1(x),W_2P_2(x),\ldots)}. \quad (11)$$

The functions $D_i(\cdot)$ represent the sensitivity of the output signal to variations of the $i^{th}$ hidden variable. For example, if $h_1(\cdot)$ represents the temperature, $D_1(\cdot)$ represents how sensitive the output signal is to temperature changes. Of note, $D_i(\cdot)$ is a general nonlinear function of the instantaneous input signal amplitude. It is perfectly possible, for example, that the output signal is highly sensitive to temperature changes for small input signals (corresponding to a temperature dependent small signal gain), but not at all for high input signals whereby the output is fully saturated.

In the structure of equation (9), a static part represented by $F_{CW}(\cdot)$ and a dynamic part represented by the summation over the hidden variables index "i" can be distinguished. The static part, which can be derived from $F(\cdot)$ using equation (10), corresponds to a classic static PHD-model. Of note, the subscript "CW" is used in $F_{CW}(\cdot)$ because this function corresponds to the response of the DUT to a single tone continuous wave (CW) excitation. Substitution of $h_i(t)$ in equation (8) using equation (4), and subsequently substitution of $\Delta_i(t)$ in equation (9) using equation (8) results in the following:

$$B(t) = F_{CW}(|A(t)|)\cdot\Phi(t) + \quad (12)$$
$$\sum_{i=1}^{N} D_i(|A(t)|)\left(\int_0^\infty P_i(|A(t-u)|)k_i(u)du - W_iP_i(|A(t)|)\right)\Phi(t).$$

Using equation (6) and changing the order of summation and integration, equation (12) can be rewritten as follows:

$$B(t) = F_{CW}(|A(t)|) \cdot \Phi(t) + \quad (13)$$

$$\int_0^\infty \left\{ \sum_{i=1}^N D_i(|A(t)|)(P_i(|A(t-u)|) - P_i(|A(t)|))k_i(u) \right\} du \cdot \Phi(t).$$

In general, it may not be known what the hidden variables are, nor how many there are or how they interact with the system. Nevertheless, the multivariate function $G(x,y,u)$ may always be defined as follows:

$$G(x, y, u) = \sum_{i=1}^N D_i(x)(P_i(y) - P_i(x))k_i(u), \quad (14)$$

such that $$B(t) = \left( F_{CW}(|A(t)|) + \int_0^\infty G(|A(t)|, |A(t-u)|, u) du \right) \Phi(t), \quad (15)$$

which is identical to equation (1). As such, equation (1) has been defined from a hidden variables approach.

Equation (14) reveals that the multivariate function $G(x,y,u)$ is not arbitrary, since the following relationship will always be valid:

$$\forall x, u: G(x,x,u) = 0 \quad (16).$$

As will be subsequently shown, this property is key in the experimental determination of the function $G(\cdot)$.

The behavioral model can be completely identified from measuring a simple set of RF large signal step responses output from the microwave component (i.e., the DUT) responsive to a set of RF large signal steps applied to the microwave component. As previously stated, the input set of RF large signal steps may be such that the signal switches from a first value to a second value at time zero, so that the whole range of possible input RF signals to the microwave component are covered. The process is explained as below.

Consider the application of a step input signal, whereby $A(t)=A_1$ for $t<0$ and whereby $A(t)=A_2$ for $t>=0$. The solution for such a large signal step response $B(t)$ will be noted as $B_{LS}(A_1,A_2,t)$, and is then given by the following:

$$\forall t<0: B_{LS}(A_1,A_2,t) = F_{CW}(|A_1|) \exp(j\phi(A_1)) \quad (17), \text{ and}$$

$$\forall t \geq 0: B_{LS}(A_1, A_2, t) = \quad (18)$$

$$F_{CW}(|A_2|)\exp(j\varphi(A_2)) + \int_0^t G(|A_2|, |A_2|, u) du \cdot \exp(j\varphi(A_2)) +$$

$$\int_t^\infty G(|A_2|, |A_1|, u) du \cdot \exp(j\varphi(A_2)).$$

Because of equation (16), equation (18) can be rewritten as follows:

$$\forall t \geq 0: B_{LS}(A_1, A_2, t) = \quad (19)$$

$$F_{CW}(|A_2|)\exp(j\varphi(A_2)) + \int_t^\infty G(|A_2|, |A_1|, u) du \cdot \exp(j\varphi(A_2)).$$

Taking the derivative versus "t" at both sides of the above equation results in the following:

$$\forall t \geq 0: \frac{dB_{LS}(A_1, A_2, t)}{dt} = -G(|A_2|, |A_1|, t) \cdot \exp(j\varphi(A_2)), \text{ or} \quad (20)$$

$$\forall t \geq 0: G(|A_2|, |A_1|, t) = -\frac{dB_{LS}(A_1, A_2, t)}{dt} \cdot \exp(-j\varphi(A_2)). \quad (21)$$

As a consequence of the inherent causality of equation (1), the function $G(x,y,t)$ only needs to be defined for positive values of "t". Equation (21) has a number of consequences. First, it allows for a straightforward measurement of the function $G(x,y,t)$, which is determined by taking the inverse of the derivative of the step response when starting with input amplitude "y" and switching to input amplitude "x" at time 0. Second, there is a one-to-one mapping between the model and the step responses. Given that all possible large signal step responses can be measured, a simple nonlinear dynamic model that is able to generate the measured large signal step responses is the model as described by equation (1). This is an advantage compared to other existing black-box memory modeling methods.

Implementation of the modeling is now described referring again to FIG. 1. As stated above, FIG. 1 is a block diagram illustrating a modeling system 10 that uses the behavioral model, according to a representative embodiment. As shown, microwave component 100, which may be characterized in the alternative as the (DUT), is connected to analyzer 200. As note previously, in this example, the microwave component 100 is a power amplifier, although other types of DUTs may be used in the alternative, such as transistors, diodes, monolithic microwave integrated circuits (MMICS), multichip modules (MCMs), non-linear electronic analog components or circuits, and non-linear RF systems, without departing from the scope of the present teachings.

The analyzer 200 is configured to generate and output a test signal A(t), which may be a set of multiple RF large signal steps, such as shown in FIG. 2. The analyzer 200 may include an independent external microwave source, or an internal microwave source of a network analyzer or non-linear network analyzer, or any source capable of providing the test signal as a stimulus. Analyzer 200 may also include as a component thereof an Agilent Technologies Nonlinear Vector Network Analyzer (NVNA) with X-Parameter technology (Agilent PNA-X) and pulsed envelope options, for example, or any analyzer, component or hardware configured or programmed to provide such a test signal. The Agilent PNA-X is available commercially from Agilent Technologies, Inc., Santa Clara, Calif. In the case of the Agilent PNA-X, the two synthesizers therein in combination with the internal pulse modulator generate the set of RF large signal steps A(t), which are input to microwave component 100. Microwave component 100 subsequently provides an output signal B(t) consisting of a simple set of RF large signal step responses responsive to the set of RF large signal steps A(t).

Figure 3:
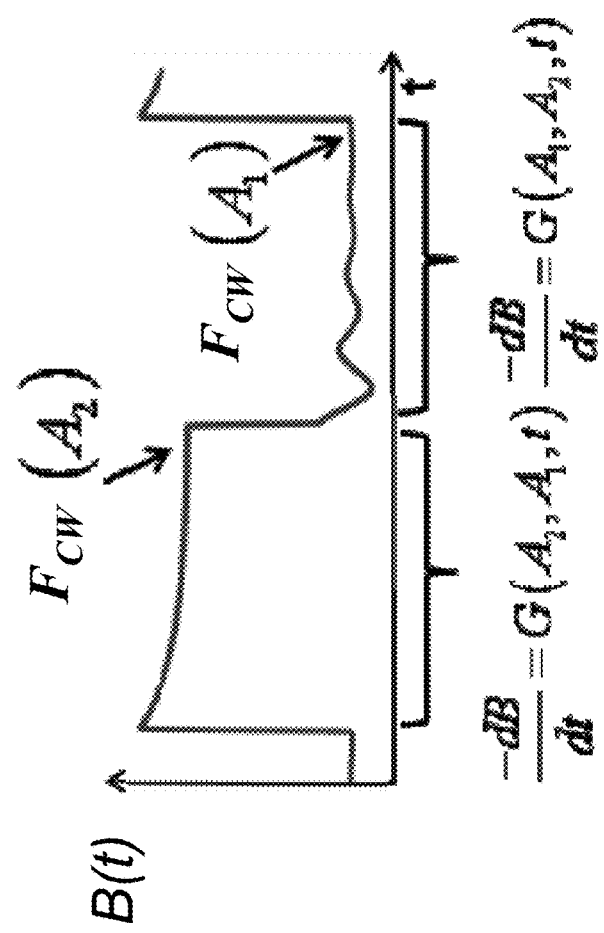
FIG. 3 is a graph illustrating a set of RF large signal step response signals output from the microwave component responsive to the set of RF large signal steps, according to a representative embodiment.

An initial step is to define the operating region power levels of microwave component 100. This sets the range of A(t), which may be a traveling wave that is applied to the input of microwave component 100. A(t) is generated as including a set of multiple RF large signal steps that are substantially quasi-perfect and clean with minimal noise, and that switch from a first initial power level A(1) at time t=0 to a second power level A(2). Both power levels A(1) and A(2) of the set of RF large signal steps A(t) such as shown in FIG. 2 are stepped across the full operating range of microwave component 100. The time duration of each step in the set of RF large signal steps A(t) is significantly longer than the duration of the long term memory effects of microwave component 100, so that the output envelope B(t) of microwave component 100, which is shown in FIG. 3 has reached steady state before the output amplitude level switches. The set of RF large signal steps A(t) may be represented as a set of points on a two dimensional grid, for example.

If the microwave component 100 were a perfect static component with no memory effects, the set of RF large signal step responses output from microwave component 100 responsive to the set of RF large signal steps A(t) would also be substantially clean steps switching from a first level corresponding to first initial power level A(1), to a second power level corresponding to second power level A(2). However, in reality, since microwave component 100 is not a perfect static component, slow transients exist in the output of microwave component 100 responsive to the set of RF large signal steps A(t). The transients are caused by the aforementioned slowly changing hidden variables that are characteristic of microwave component 100. The hidden variables are not directly observable, and may for instance be temperature, bias voltages, or trapping effects within microwave component 100. Although the hidden variables themselves are not directly observable, their effects on the output B(t) of microwave component 100 are however observable. In a representative embodiment, the memory effects are extracted as the dynamic part of model equation (1), and are used to simulate how the hidden variables would affect arbitrarily modulated signals that may be applied to microwave component 100, so as to predict corresponding responses of microwave component 100 to the arbitrarily modulated signals.

Referring again to FIG. 1, analyzer 200 measures the corresponding output envelope signal B(t) consisting of the set of RF large signal step responses generated by microwave component 100 responsive to the set of RF large signal steps A(t). Analyzer 200 may include an oscilloscope, or any component or hardware configured or programmed to provide such measurement. The output envelope signal B(t) contains all the information needed to directly extract the model parameters. That is, for each of the points on the above noted two dimensional grid, the corresponding value of the output envelope B(t) is measured and recorded. As shown in FIG. 3, for example, the steady state values of B(t) after the transient is over correspond to the values of the static part represented by $F_{CW}(A_2)$ and $F_{CW}(A_1)$. The negative time derivatives $-dB/dt$ of B(t) correspond to the dynamic part represented as the values of $G(A_2, A_1, t)$ and $G(A_1, A_2, t)$. Repeating this measurement for an entire range of $A_1$ and $A_2$ for the multiple RF large signal step responses provides complete knowledge of the model kernels $F_{CW}(\cdot)$ and $G(\cdot)$ described by equation (1). The values of $F_{CW}(A_2)$ and $F_{CW}(A_1)$ as measured by analyzer 200, and the negative time derivatives of $G(A_2, A_1, t)$ and $G(A_1, A_2, t)$ as determined by analyzer 200 may be collected in tabular form. Thus, direct mapping between the measurements and the parameters of the model is realized in accordance with representative embodiments. This mapping can be characterized as a three dimensional model for the dynamic part, whereby each value of $G(\cdot)$ is relative to two input amplitudes and a time instant. A closed, well defined measurement is thus realized and the excitation is rich enough to extract the model.

The measured model kernels $F_{CW}(\cdot)$ and $G(\cdot)$ are then provided from analyzer 200 to simulator 300, as further shown in FIG. 1. Simulator 300 uses the measured model kernels $F_{CW}(\cdot)$ and $G(\cdot)$ described by equation (1), in particular, the values of $F_{CW}(A_2)$ and $F_{CW}(A_1)$ and the integral values of $G(A_2, A_1, t)$ and $G(A_1, A_2, t)$, to predict the output of microwave component 100 responsive to any arbitrarily modulated signal input to simulator 300. Simulator 300 can predict the output of the microwave component 100 responsive to complex arbitrarily modulated signal types, such as code division multiple access (CDMA), WCDMA, CDMA 2000, and time spread modulation (TSM), for example, responsive to steps, pulses, two-tone excitations and continuous waves, and responsive to noise-like modulations. The predicted response by the microwave component 100 is shown as output from simulator 300 in FIG. 3. Simulator 300 may be an Agilent ADS (advanced design system) commercially available from Agilent Technologies, Inc., Santa Clara, Calif., for example, or any platform, component or hardware configured or programmed to simulate envelope signals.

Figure 4:
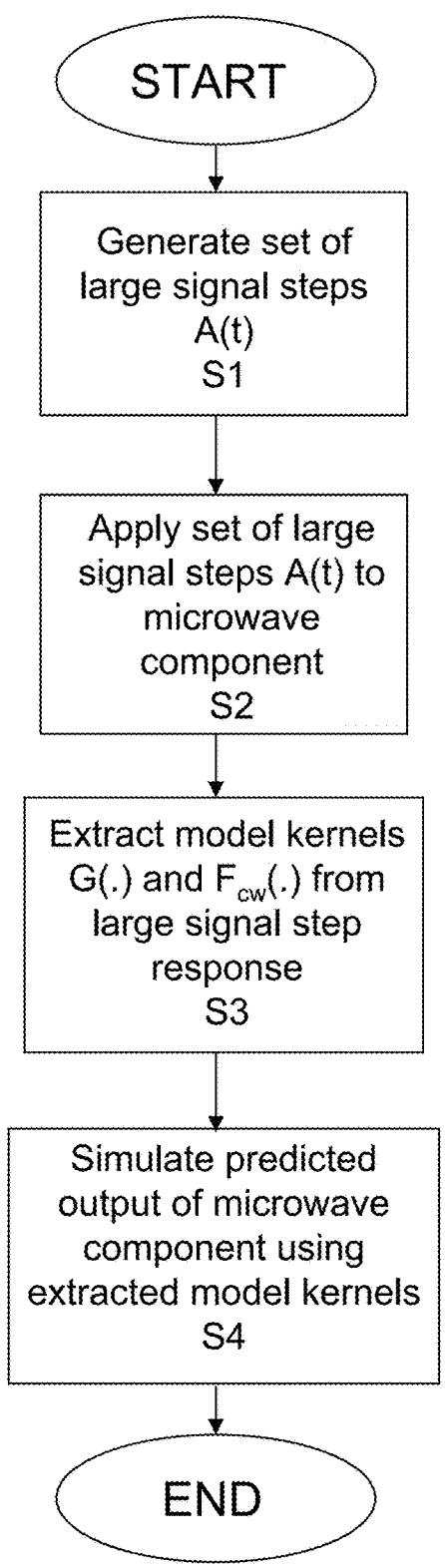
FIG. 4 is a flow chart illustrating a process for modeling a microwave component, according to a representative embodiment.

FIG. 4 is a flow chart showing a modeling process using modeling system 10, in accordance with a representative embodiment. The modeling begins at step S1, where analyzer 200 generates a set of multiple RF large signal steps A(t) that are substantially quasi-perfect and clean with minimal noise, and that cover the entire range of possible input RF signals to the microwave component 100, as discussed above. In step S2, the set of RF large signal steps A(t) are applied to microwave component 100 as the DUT. Responsive to the set of RF large signal steps, microwave component 100 generates multiple RF large signal step responses B(t). In step S3, analyzer 200 extracts from the RF large signal step responses B(t) model kernels $G(\cdot)$ and $F_{CW}(\cdot)$, respectively representative of the dynamic and static parts of the model. In step S4, simulator 300 uses the extracted model kernels $G(\cdot)$ and $F_{CW}(\cdot)$ to predict the output of microwave component 100 in response to any type of modulated signal.

Figure 5:
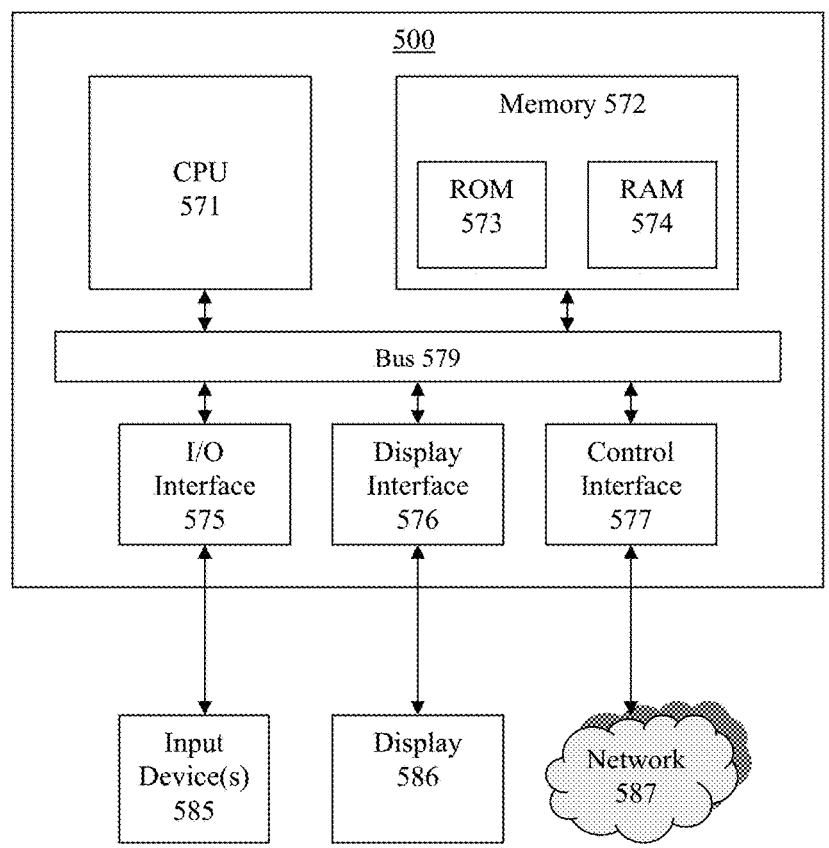
FIG. 5 is a functional block diagram illustrating a controller for operating the modeling system, according to a representative embodiment.

FIG. 5 is a functional block diagram illustrating a computer system 500, for executing an algorithm to control operations of modeling system 10, according to a representative embodiment. The computer system 500 may be any type of computer processing device, such as a PC, capable of executing the various steps of the programming language translation process. In various embodiments, the computer system 500 may be included in analyzer 200, simulator 300, and/or a separate controller or other processing device (not shown), or may be distributed among one or more of these devices.

In the depicted representative embodiment, the computer system 500 includes central processing unit (CPU) 571, memory 572, bus 579 and interfaces 575-577. Memory 572 includes at least nonvolatile read only memory (ROM) 573 and volatile random access memory (RAM) 574, although it is understood that memory 572 may be implemented as any number, type and combination of ROM and RAM and of internal and external memory. Memory 572 may provide look-up tables and/or other relational functionality. In various embodiments, the memory 572 may include any number, type and combination of tangible computer readable storage media, such as a disk drive, compact disc (e.g., CD-R/CD/RW), electrically programmable read-only memory (EPROM), electrically erasable and programmable read only memory (EEPROM), digital video disc (DVD), universal serial bus (USB) drive, diskette, floppy disk, and the like. Further, the memory 572 may store program instructions and results of calculations performed by CPU 571.

The CPU 571 is configured to execute one or more software algorithms, including control of the modeling system 10 according to various embodiments described herein, e.g., in conjunction with memory 572. The CPU 571 may include its own memory (e.g., nonvolatile memory) for storing executable software code that allows it to perform the various functions. Alternatively, the executable code may be stored in designated memory locations within memory 572. The CPU 571 may execute an operating system, such as Windows® operating systems available from Microsoft Corporation or Unix operating systems (e.g., Solaris™ available from Sun Microsystems, Inc.), and the like.

In an embodiment, a user and/or other computers may interact with the computer system 570 using input device(s) 585 through I/O interface 575. The input device(s) 575 may include any type of input device, for example, a keyboard, a track ball, a mouse, a touch pad or touch-sensitive display, and the like. Also, information may be displayed by the computer system 500 on display 586 through display interface 576, which may include any type of graphical user interface (GUI), for example.

The computer system 500 may also include a control interface 577 for communicating with various components of modeling system 10. For example, in various embodiments, the computer system 500 is able to communicate with the microwave component 100 to receive the set of RF large signal step responses, the analyzer 200 to define the operating region power levels of microwave component 10 and/or the simulator 300 to provide the arbitrarily modulated signal for simulation, as discussed above, via a wired or wireless LAN, for example, indicated by network 587. The control interface 577 may include, for example, a transceiver (not shown), including a receiver and a transmitter, that communicates wirelessly over a data network through an antenna system (not shown), according to appropriate standard protocols. However, it is understood that the control interface 577 may include any type of interface, without departing from the scope of the present teachings.

The various "parts" shown in modeling system 10 may be physically implemented using a software-controlled microprocessor, hard-wired logic circuits, or a combination thereof. In an embodiment, computer system 500 may carry out the functionality of analyzer 200 and/or simulator 300. In a further embodiment, computer system 500 may also model or provide a virtual representation of microwave component 100 in addition to carrying out the functionality of analyzer 200 and/or simulator 300. In this further embodiment, computer system 500 may also generate or otherwise provide the set of RF large signal steps, which themselves may be simulated, to the virtual representative of microwave component 100, whereby the virtual representative of microwave component 100 may subsequently provide the RF large signal step response for simulation. Computer system 500 may thus be configured to carry out all or part of the functionality of modeling system 10 using program instructions stored in any number, type and combination of the above noted tangible computer readable storage media. Modeling system 10 may thus be virtually implemented.

The various "parts" shown in the computer system 500 may be physically implemented using a software-controlled microprocessor, hard-wired logic circuits, or a combination thereof. Also, while the parts are functionally segregated in the computer system 500 for explanation purposes, they may be combined variously in any physical implementation.

As would be apparent to one of ordinary skill, modeling system 10 can model other various frequency phenomena, such as for example non-linear optical phenomena, and non-linear mechanical phenomena including sound, vibration, shock wave and distortions. In view of this disclosure, those skilled in the art can implement these applications while remaining within the scope of the appended claims.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

Therefore the invention should not be limited to the particular example embodiments described in detail above.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method of modeling a non-linear component, the method comprising:
   applying a predetermined test signal to the non-linear component to produce an output envelope signal, the predetermined test signal comprising a set of repeating large signal steps corresponding to different power levels, respectively;
   extracting model functions from the output envelope signal, the model functions corresponding to a dynamic part and a static part of the output envelope signal, the dynamic part representing memory effects of the non-linear component; and
   using the extracted model functions to simulate predicted outputs of the non-linear component responsive to other input signals of different modulation types.

2. The method of claim 1, wherein the set of large signal steps switch between the corresponding power levels of the predetermined test signal at an initial time from a first value to a second value, and cover an entire range of possible input signal amplitude values to the non-linear component.

3. The method of claim 1, wherein a time duration of each large signal step in the set of large signal steps is longer than a duration of the memory effects of the non-linear component.

4. The method of claim 1, wherein said extracting model functions is software implemented.

5. The method of claim 1, wherein said extracting model functions is hardware implemented.

6. The method of claim 1, wherein said extracting model functions comprises taking a time derivative of a set of signal steps of the output envelope signal to obtain the dynamic part of the output envelope signal.

7. The method of claim 1, wherein values of the model functions are extracted and collected in tabular form.

8. The method of claim 1, wherein the dynamic part of the output envelope signal changes responsive to varying operational conditions of the non-linear component including at least one of temperature, bias voltage and trapping states.

9. The method of claim 1, wherein the non-linear component is a power amplifier.

10. The method of claim 1, wherein the non-linear component is a microwave component.

11. A system for modeling a non-linear component comprising:

an analyzer configured to generate a set of repeating large signal steps corresponding to different power levels, respectively, apply the set of large signal steps to the non-linear component which provides an output envelope signal responsive to the set of large signal steps, and to extract model functions from the output envelope signal provided by the non-linear component, the model functions corresponding to a static part and a dynamic part of the output envelope signal, and the dynamic part representing memory effects of the non-linear component; and a simulator configured to simulate predicted outputs of the non-linear component responsive to other input signals of different modulation types using the extracted model functions from the analyzer.

12. The system of claim 11, wherein the set of large signal steps switch between the corresponding power levels at an initial time from one value to another, and cover an entire range of possible input signal amplitude values to the non-linear component.

13. The system of claim 11, wherein a time duration of each large signal step in the set of large signal steps is longer than a duration of the memory effects of the non-linear component.

14. The system of claim 11, wherein the analyzer takes a time derivative of a set of signal steps of the output envelope signal to obtain the dynamic part of the output envelope signal.

15. The system of claim 11, wherein the analyzer collects values of the extracted model functions in tabular form.

16. The system of claim 11, wherein the dynamic part of the output envelope signal changes responsive to varying operational conditions of the non-linear component including at least one of temperature, bias voltage and trapping states.

17. The system of claim 11, wherein the non-linear component is a power amplifier.

18. The system of claim 11, wherein the non-linear component is a microwave component.

19. A non-transitory computer readable medium that stores a program executable by a computer for modeling a non-linear component, the computer readable medium comprising:

an applying code segment for applying a predetermined test signal to the non-linear component to produce an output envelope signal, the predetermined test signal comprising a set of repeating large signal steps;

an extracting code segment for extracting model functions from the output envelope signal, the model functions corresponding to a dynamic part and a static part of the output envelope signal, the dynamic part representing memory effects of the non-linear component; and a simulating code segment for simulating predicted outputs of the non-linear component responsive to other input signals of different modulation types, using the extracted model functions, wherein a time duration of each large signal step in the set of large signal steps is longer than a duration of the memory effects of the non-linear component.

20. The computer readable medium of claim 19, wherein the large signal steps in the set of large signal steps switch repeatedly between a first power level to a second power level different from the first power level.

* * * * *